United States Patent [19]

Eller

[11] Patent Number: 5,121,064
[45] Date of Patent: Jun. 9, 1992

[54] METHOD AND APPARATUS FOR CALIBRATING RESISTANCE BRIDGE-TYPE TRANSDUCERS

[75] Inventor: Eldon E. Eller, Seattle, Wash.

[73] Assignee: Allied-Signal, Inc., Morris Township, Morris County, N.J.

[21] Appl. No.: 576,244

[22] Filed: Aug. 31, 1990

[51] Int. Cl.$^5$ ........................................... G01R 27/02
[52] U.S. Cl. .................................... 324/601; 324/724; 324/706; 324/721; 374/173
[58] Field of Search ................. 73/862.65; 374/173; 324/601, 725, 706, 610

[56] References Cited

U.S. PATENT DOCUMENTS

| | | |
|---|---|---|
| 3,130,578 | 4/1964 | Ames, Jr. . |
| 3,439,258 | 4/1969 | Van Leewen ................. 324/601 |
| 3,605,008 | 9/1971 | Shoemaker ................. 374/173 |
| 3,841,150 | 10/1974 | Pearson . |
| 3,943,434 | 3/1976 | Haeusler ................. 374/173 |
| 4,057,755 | 11/1977 | Piesche ................. 374/173 |
| 4,081,744 | 3/1978 | Ray . |
| 4,174,639 | 11/1979 | Raven . |
| 4,190,804 | 2/1980 | Pyne et al. . |
| 4,298,969 | 11/1981 | Rickenbacker ................. 324/601 |
| 4,299,130 | 11/1981 | Koneval . |
| 4,414,853 | 11/1983 | Bryzek ................. 374/173 |
| 4,651,033 | 3/1987 | Yasutake ................. 307/494 |
| 4,658,651 | 4/1987 | Le . |
| 4,715,003 | 12/1987 | Keller et al. . |
| 4,841,229 | 6/1989 | Eccleston ................. 374/173 |

FOREIGN PATENT DOCUMENTS 2124384 2/1984 United Kingdom ................. 374/173

*Primary Examiner*—Kenneth A. Wieder
*Assistant Examiner*—Jose M. Solis
*Attorney, Agent, or Firm*—Terry L. Miller; Robert A. Walsh

[57] ABSTRACT

A system and method for calibrating a transducer having a bridge-type network. The calibration includes a source of constant current and a calibration circuit including the source connected across one of the resistive-type transducer elements of the bridge. Switching means are provided in the calibration circuit so that the current can be selectively supplied to or withheld from the resistive-type transducer element across which the calibration circuit means is connected for producing a calibration signal. The calibration signal is substantially independent of the transducer output regardless of whether or not the signal is temperature compensated and whether it is switched mechanically, electromechanically, or electrically. An internal calibration resistor in the current source is used to make the current inversally proportional to the bridge arm resistance. The calibration resistor tracks the resistive-type transducer elements of the bridge over temprature. The calibration resistor is chosen to have almost any convenient value and it need not be trimmed. The change in output voltage produced by switching in the calibration current is independent of temperature provided the calibration resistor accurately tracks the bridge resistors. Furthermore, the output voltage is substantially constant even when the bridge is significantly unbalanced.

34 Claims, 2 Drawing Sheets

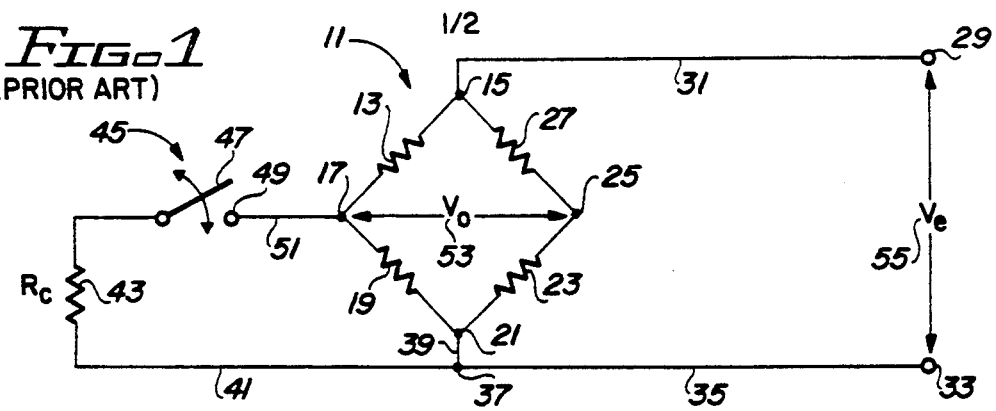
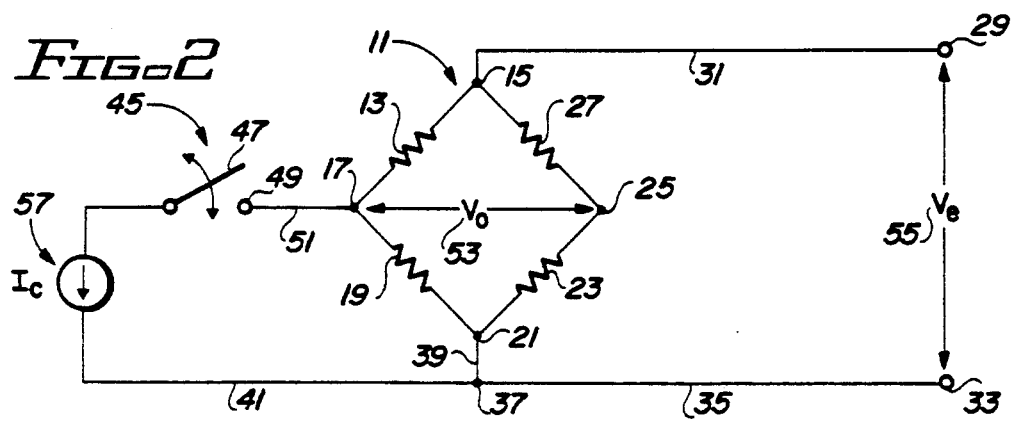
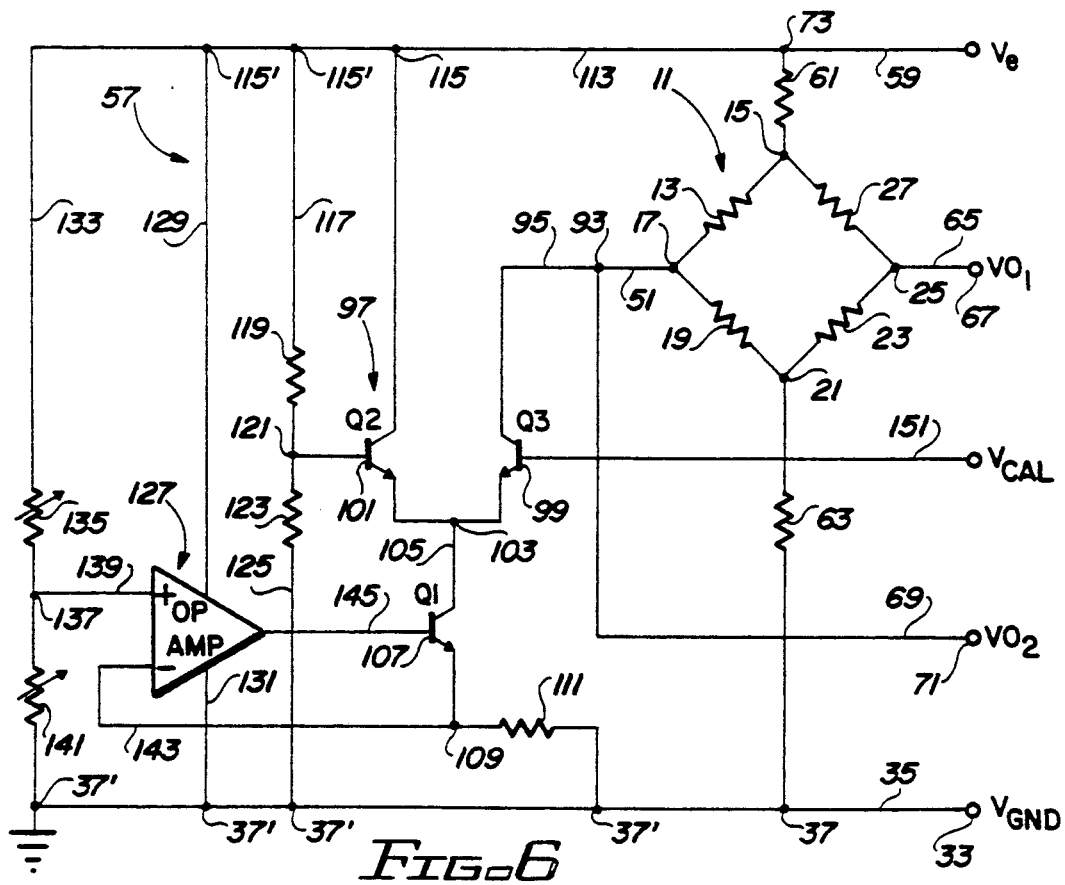

METHOD AND APPARATUS FOR CALIBRATING RESISTANCE BRIDGE-TYPE TRANSDUCERS

BACKGROUND OF THE INVENTION

1. Field Of The Invention

The present invention relates generally to a method and apparatus for calibrating resistance bridge-type transducers, and more particularly, to such a method and apparatus whereby a source of substantially constant current is selectively switched across one of the resistance elements of the bridge for calibration purposes.

2. Brief Description of The Prior Art

Bridge-type transducers have traditionally been checked by noting the change in transducer output voltage caused by switching a known-resistor in parallel with one of the arms of the bridge. This procedure is referred to as "shunt calibration".

This term is actually a misnomer insomuch as the procedure does not actually determine the sensitivity of the bridge to a change in the measurand. Nevertheless, shunt calibration is a very useful test since it checks the integrity of the transducer, cabling, and signal-conditioning equipment. Indeed, it is hard to imagine any system fault short of the transducer falling off that would not be detected by shunt calibration.

The principle drawback of shunt calibration, as it is currently practiced, is that a given shunt resistor produces a different output from every transducer since no two transducers have exactly the same resistances. Furthermore, the arms of silicon PR transducers have large temperature coefficients of resistance, so the output produced by a given shunt resistor changes with temperature.

In principle, these drawbacks could be overcome by building the shunt calibration resistor into the transducer. The calibration resistor could be trimmed to produce the desired offset, and could be made with the same temperature coefficient as the bridge resistors. The calibration resistor could be switched in and out remotely by an electronic switch. Practically, it is most difficult to trim a diffused silicon resistor, and the electronic switch would require low, stable "on" resistance and high "off" resistance.

Other disadvantages and complexities of shunt calibration will be discussed hereinafter.

SUMMARY OF THE INVENTION

It is an object of the present invention to provide an improved method for calibrating a resistance bridge-type transducer.

It is another object of this invention to provide a method for calibrating a resistance bridge-type transducer wherein a constant current source is selectively switched in parallel with one of the resistive legs of the bridge to output a calibration signal.

It is still another object of this invention to provide such a method wherein the calibration output signal is substantially independent of transducer output, whether or not it is temperature compensated, and whether it is switched mechanically, electromechanically, or electrically.

It is yet another object of the present invention to provide an improved system for calibrating a resistance bridge-type transducer.

It is yet a further object of this invention to provide a system for calibrating a resistance bridge-type transducer in which a source of substantially constant current is selectively switched across one of the resistive elements of the bridge for generating a calibration signal.

It is another object of the present invention to provide such a system in which said calibration signal is substantially independent of the transducer output, whether or not it is temperature compensated, and whether it is switched mechanically, electromechanically, or electrically.

It is an object of the present invention to provide a method and apparatus for calibrating resistive bridge-type transducers by selectively switching a constant current source into one of the bridge nodes for calibration purposes, and wherein said constant current source includes a calibration resistor $R_c$.

It is another object of this invention to provide such a method and apparatus wherein $R_c$ is designed to track the resistance elements of the bridge.

It is another object of this invention to provide such a method and apparatus wherein $R_c$ has the same temperature coefficient as the resistive elements of the bridge and operates in the same thermal environment.

It is still another object of this invention to provide such a method and apparatus where $R_c$ can have substantially any convenient value and need not be trimmed.

It is yet a further object of the present invention to provide a method and apparatus for calibrating resistance bridge-type transducers wherein a constant current source is selectively switched into one of the bridge nodes and wherein the constant current source is made inversely proportional to the bridge arm resistance by an internal calibration resistor $R_c$.

It is another object of this invention to provide such a method and apparatus wherein the change in transducer output signal produced by switching the calibration test current through one leg of the bridge is independent of temperature provided the internal calibration resistor accurately tracks the resistive elements of the bridge.

It is a further object of the present invention to provide such a method and apparatus wherein the transducer is an integrated circuit, and wherein the internal calibration resistor $R_c$ may be a part of said integrated circuit or independent thereof.

It is still another object of this invention to provide such a method and apparatus wherein the switching is done electrically.

It is yet another object of this invention to provide such a method and apparatus wherein the electrical switching is done using a differential pair.

It is a further object of the present invention to provide such a method and apparatus wherein the constant current source utilizes an operational amplifier, a positive voltage reference, a transistor, and negative feedback.

It is still a further object of the present invention to provide a method and apparatus for electrically switching shunt calibration without the use of relays or other mechanical switches.

It is yet a further object of this invention to provide such a method and apparatus wherein a simple current source set up by a diffused resistor in the transducer can be used so as to provide a very accurate shunt calibration signal whether the bridge is balanced or not.

The present invention provides a method of calibrating a transducer which is arranged in a bridge configuration and includes four bridge legs each of which includes a resistive-type transducer element, the elements being coupled at corresponding bridge nodes, and wherein the method comprises the steps of providing a source of substantially constant current, connecting the source in a calibration circuit across one of the resistive-type transducer elements of the bridge configuration and then selectively switching the source into and out of the calibration circuit for generating a calibration signal.

The calibration signal is substantially independent of the transducer output, whether or not it is temperature compensated, and whether it is switched mechanically, electromechanically, or electrically.

The present invention also contemplates a system for calibrating a transducer wherein the transducer comprises a bridge-type network having four bridge legs each including a resistive-type transducer element joined at four intermediate bridge nodes, the calibration system includes a source of substantially constant current and a calibration circuit means including the source of substantially constant current wherein the circuit means is connected across one of the resistive-type transducer elements of the bridge. A switching means is then operatively disposed in the calibration circuit means and used for selectively shutting off the supply of current to one of the resistive-type transducer elements and for turning on the supply of calibration current to said one of said resistive-type transducer elements for generating a calibration signal.

The calibration signal has the advantage that it is substantially independent of the transducer output regardless of whether or not it is temperature compensated and whether it is switched mechanically, electromechanically, or electrically.

The system contemplates that the switching means may be either a mechanical switch, an electromechanical switch, or an electrical switch, although an electrical switch is the preferred embodiment of the present invention.

The calibration system of the present invention contemplates that the transducer may be any device such as a pressure transducer, an accelerometer, a strain gauge, or any similar device. It further contemplates that the resistive-type transducer elements include strain gauge resistors, thermisters, resistors, and any similar device.

The system contemplates that the transducer is an integrated circuit and that at least the calibration resistor is part of the integrated circuit or independent thereof. The present invention contemplates that the calibration resistor will track the resistive-type transducer elements of the bridge over temperature. Furthermore, the calibration resistor is used to make the source of substantially constant current inversely proportional to the bridge arm resistance. Yet further, the calibration resistor can be of almost any value any convenient value, and it need not be trimmed. Still further, the output voltage produced by switching in the calibration current is independent of temperature provided the calibration resistor accurately tracks the bridge resistors and the calibration output voltage from the transducer is substantially constant even when the bridge is significantly unbalanced.

In the preferred embodiment of the present invention, the current source includes an operational amplifier and a single transistor, and the electronic switching means includes a differential pair.

BRIEF DESCRIPTION OF THE DRAWINGS

FIG. 1 shows a bridge-type transducer being calibrated by the "shunt calibration" method of the prior art;

FIG. 2 illustrates a bridge-type transducer being calibrated by the method and system of the present invention;

FIG. 6 is the preferred embodiment of the method and system for calibrating a bridge-type transducer contemplated by the preferred embodiment of the present invention.

DETAILED DESCRIPTION OF THE PREFERRED EMBODIMENT

Figure 3:
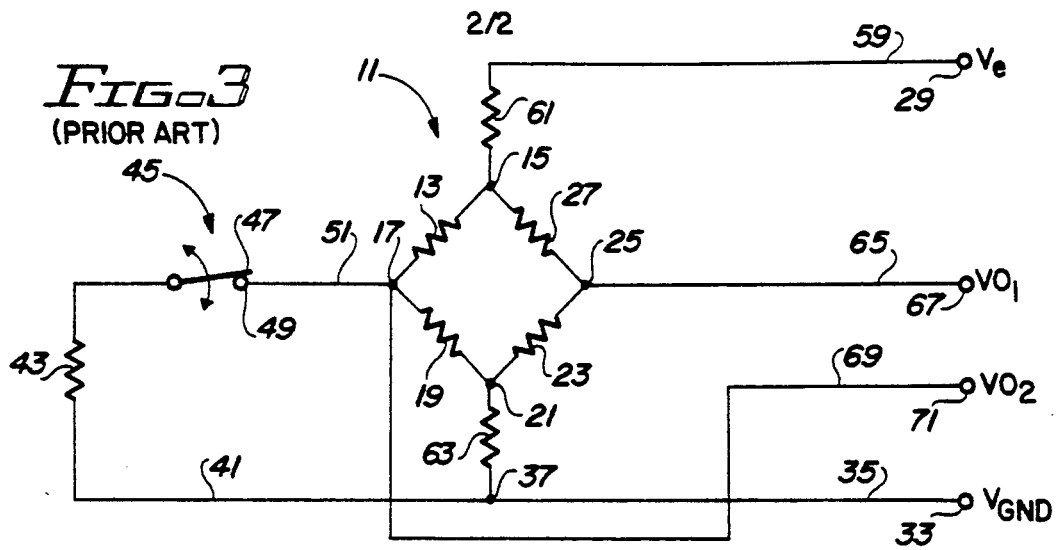
FIG. 3 illustrates another bridge-type transducer having series resistors and being calibrated by the "shunt calibration" technique of the prior art.

FIG. 1 illustrates a bridge-type transducer 11. The transducer 11 includes a first resistive element 13 connected between a bridge node 15 and a bridge node 17. A second resistive means 19 connects the bridge node 17 with a bridge node 21. Bridge node 21 is connected to a bridge node 25 via resistive element 23, and resistive element 27 connects bridge node 25 to bridge node 15. Input node 29 is connected via lead 31 to bridge node 15 while bridge node 21 is connected to ground node 37 through a lead 39. Ground node 37 is connected via lead 35 to a ground terminal 33. Node 37 is also connected through a lead 41 to one terminal of a calibration resistor 43 whose opposite terminal is connected to the moveable arm 47 of a mechanical switch 45. The switch 45 also includes a contact 49 connected via lead 51 to the bridge node 17. The measurement of the output voltage or $V_o$ is indicated by reference numeral 53 while the excitation voltage $V_e$ is indicated by reference numeral 55. When it is desired to provide "shunt calibration", the switch arm 47 is closed upon switch contact 49 placing the calibration resistor 43 in parallel with resistive element 19 of the bridge 11.

For the simple bridge circuit of FIG. 1, having four equal active arms with shunt calibration, the calibration output signal is given by $$V_c = V_e \frac{(R - \Delta R)(R^2 - (\Delta R)^2)}{2R[R^2 + 2RR_c - (\Delta R)^2]}$$

In this equation, $V_c$ is the calibration signal (the change in bridge output produced by switching in the shunt calibration resistor, $V_e$ is the excitation voltage of the bridge, $R_c$ is the shunt calibration resistance, R is the unstressed resistance of a bridge arm, and $\Delta R$ is the increment of bridge arm resistance produced by applied stress.

FIG. 2 illustrates a relatively simple bridge-type network employing the concept of the present invention. In FIG. 2, a resistive-type bridge network 11 is used as a transducer. In the bridge 11, a first resistive element 13 is connected between a bridge node 15 and a bridge node 17. A second resistive element 19 is connected between bridge node 17 and bridge node 21, while a third resistive element 23 is connected between bridge node 21 and bridge node 25. Lastly, a fourth resistive element 27 is connected between the first bridge node 15 and bridge node 25 to form a conventional bridge-type network. A source of excitation voltage $V_e$ is indicated by reference numeral 55 and the positive input 29 is connected via lead 31 to the first bridge node 15. Bridge node 21 is connected through a lead 39 to ground node 37, and ground node 37 is connected through lead 35 to the opposite terminal 33 of the excitation signal $V_e$. Node 37 is also connected via lead 41 to the source of substantially constant current 57. The opposite terminal of the constant current source 57 is connected to a switch arm 47 of a switch 45 which may be closed upon a switch contact 49 to supply excitation current to the bridge node 17 via lead 51. The transducer output $V_o$ is represented by reference numeral 53.

For this simple bridge-type circuit, using current calibration, the calibration signal is given by the equation $$V_c = I_c \frac{R^2 - (\Delta R)^2}{2R}$$

Where capital $I_c$ is the calibration current and the other symbols have the same meaning as given previously. Note that in the first equation using conventional "shunt calibration", $V_c$ varies with $\Delta R$, while in the equation using a switched constant current source, the equation varies only with $(\Delta R)^2$. Since the full-scale R for semiconductor resistance bridge transducers is on the order of 0.05 R, $V_c$ using shunt calibration, will vary approximately ±5% over the range of the instrument, while $V_c$ using current calibration will vary only +0, −0.25%. It is also important to note that in the current calibration process, a calibration signal is produced which is substantially independent of the transducer output, whether it is temperature compensated or not, and whether it is switched on mechanically, electromechanically, or electrically.

Figure 4:
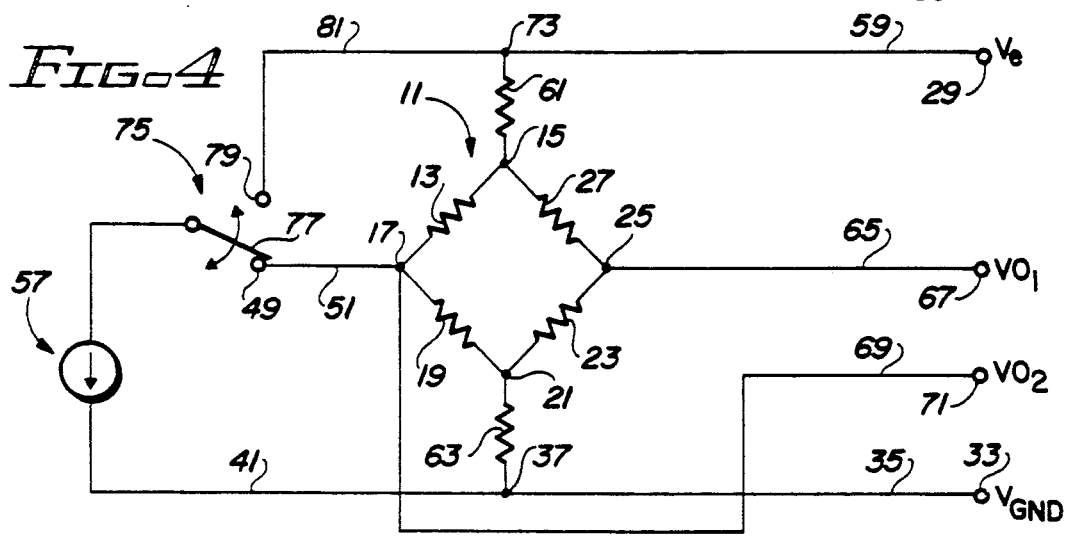
FIG. 4 is a bridge-type transducer having series resistors and being calibrated by the method and system of the present invention.

FIGS. 3 and 4 show simple bridge-type transducers wherein series resistors have been added which greatly complicates calculations and the like. In FIG. 3, a bridge-type network 11 is shown as a transducer. The bridge-type network 11 includes a first resistive element 13 operatively coupled between a first bridge node 15 and a second bridge node 17. Resistive element 19 is connected between bridge node 17 and a bridge node 21. Resistive element 23 is connected between bridge node 21 and bridge node 25, while a resistive element 27 is connected between bridge node 15 and bridge node 25. A first series resistor 61 is connected between the bridge node 15 and lead 59 from the source of excitation signals 29. Node 21 is connected through a second series resistor 63 to a ground node 37. Ground node 37 is connected to a ground terminal output 33 via lead 35 and through a lead 41 to one terminal of a calibration resistor 43 whose opposite terminal is connected to the moveable switch arm 47 of a switch assembly 45 which is shown as being closed upon switch contact 49 so as to place the calibration resistor 43 in shunt or in parallel across resistive element 19 and series resistor 63 via lead 51.

These series resistors 61 and 63 are commonly added to semiconductor resistance-type bridge transducers to make the sensitivity less temperature dependent. This greatly complicates the shunt calibration equation as shown herein below.

$$V_c = V_e \frac{4RR_c(R_s + 2R_c + R - \Delta R) - R_c[R^2 - (\Delta R)^2]}{D} -$$

$$V_e \frac{(R + \Delta R)^2(R_s + R_c + R - \Delta R) + R_s[4RR_c + R^2 - (\Delta R)^2]}{D}$$

Where $R_s$ is the resistance of the calibration resistor and $$D = 4R(R_s + R_c + R + \Delta R)(R_s + R_c R - \Delta R) - 2R_c[R^2 - (\Delta R)^2] - (R + \Delta R)(R_s + R_c + R - \Delta R)$$

This equation is so unwieldy that it cannot readily be used for calibration purposes.

However, in the simple bridge-type circuit including series resistors of FIG. 4 utilizing the current calibration of the present invention, a far simpler equation results.

In FIG. 4, a plurality of resistive elements are configured in a bridge-type network 11 to form a transducer. A first resistive element 13 is connected between a first bridge node 15 and a second bridge node 17. A second resistive element 19 is connected between the bridge node 17 and a third bridge node 21. A third resistive element 23 is connected between bridge node 21 and bridge node 25, and a fourth resistive element 27 is connected between the first bridge node 15 and the fourth bridge node 25. A source of excitation voltage 29 is connected via lead 59 to a supply node 73, and supply node 73 is connected through a first series resistor 61 to the first bridge node 15. Node 73 is also connected via lead 81 to a switch terminal 79 for use as herein after described.

The third bridge node 21 is connected through a second series resistor 63 to a ground node 37. Ground node 37 is connected via lead 35 to a ground terminal 33, and is connected via lead 41 to the output of the constant current source 57 whose input is connected to the moveable switch arm 77 of 2-position switch 75. In FIG. 4, the switch arm 77 is shown as being closed upon terminal 49 so as to supply the calibration current from the constant current source 57 to the bridge node 17 via lead 51. However, switch arm 77 is positionable to break with contact 49 and to connect to contact 79 so as to divert the constant current source to the supply.

Lastly, a first transducer output $VO_1$ is taken from bridge output node 25 via lead 65 and terminal 67, and a second output $VO_2$ is taken from bridge node 17 via lead 69 and output terminal 71.

The current calibration system of the present invention renders the calibration equation far simpler than that required for shunt calibration even though the series resistors have been added to the circuit of FIG. 4. In fact, the total equation is given as $$V_c = I_c \frac{R^2 - (\Delta R)^2}{2R}$$

which is the same as the equation for a simple bridge.

There are some additional, practical advantages to current calibration as opposed to shunt calibration, especially when temperature compensating the calibration signal. With temperature compensated shunt calibration, it is necessary to provide a calibration resistor with an order of magnitude larger resistance than the bridge resistors. The calibration resistor must have the same temperature coefficient as the bridge resistors, which implies that it should be formed by the same process, diffusion, or ion implantation, in the case of the semiconductor bridge. Furthermore, the shunt resistor must be adjusted if one is to provide a specified calibration signal. Lastly, the temperature coefficient must be adjusted if the bridge uses shunt resistors, as is the usual case, shown in FIG. 3. This is because the dependence of $V_c$ upon $R_s$, as shown in the equation above, is critical. While none of this is impossible, it is certainly inconvenient and difficult.

Temperature compensated current calibration also requires a resistor with a same temperature coefficient as the bridge resistors and in the same thermal environment. This resistor is used to establish the calibration current. However, this resistor can be of any conventional value and need not be trimmed. The current can be trimmed to provide a specified calibration signal by adjusting a potentiometer or an ordinary resistor. The potentiometer or adjusting resistor may be located at any convenient distance from the transducer. Finally, the simplicity of the last equation above shows that the calibration signal is independent of the shunt resistors, and the thermally sensitive resistor need not have its temperature coefficient adjusted to account for the series resistors.

Therefore, the current calibration signal used with FIGS. 2 and 4 above, are substantially independent of the transducer output signal. This is true whether the transducers uses series resistors or not, and whether the calibration signal is temperature compensated or not. Furthermore, it is true whether the devices uses mechanical, electromechanical, or electrical switching. If the current calibration signal is to be temperature compensated, it can make use of practically any convenient size of resistor that matches the temperature coefficient of the bridge resistors and is in the same thermal environment, which is relatively easy to do. The calibration current signal can be trimmed to provide a specified calibration signal by adjusting a convenient potentiometer or resistor or an internal or external voltage source.

In FIG. 4, the current may be made inversely proportional to the bridge arm resistance by an internal calibration resistor D. Therefore the current changes to compensate for thermal change in bridge resistance. The resistor can be almost any value. For convenience, it could be made equal to the arm resistance. It need not be trimmed. Instead, the current may be adjusted to produce the desired output by trimming a voltage divider made from trimmable resistors or an internal or external voltage source. The current may be readily switched on and off with a simple bipolar transistor and the "on" resistance of the switch is not critical.

The change in output voltage produced by switching the test current through the bridge is independent of temperature provided the internal resistor accurately tracks the bridge resistors with temperature. Furthermore, the change in output voltage is very nearly constant even when the bridge is significantly unbalanced by the measurand.

Figure 5:
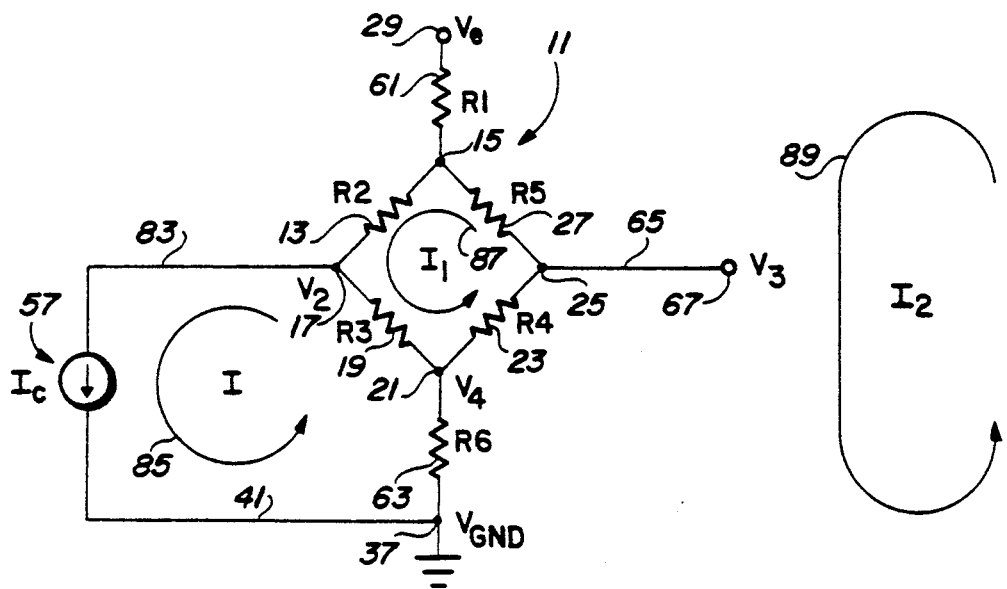
FIG. 5 is a current loop diagram of a transducer being calibrated by the method and system of the present invention.

FIG. 5 shows a bridge-type transducer 11 used for explaining the current circulation therein. The bridge arms are not necessarily equal nor are the series resistors necessarily equal. In FIG. 5, a resistor $R_2$ is designated by reference numeral 13 and connected between a first bridge node 15 and a second bridge node 17. Bridge node 17 is connected to bridge node 21 through a resistive element $R_3$ referred to by reference numeral 19. Resistive element 23, shown as $R_4$ has one terminal connected to bridge node 21 and its opposite terminal connected to bridge node 25, and lastly, resistive element 27 or $R_5$ has one terminal connected to bridge node 25 and its opposite terminal connected to bridge node 15 to form a conventional bridge-type network or bridge configuration. A source of excitation voltage $V_e$ is taken from input 29 and supplied through a first series resistor 61 or $R_1$ to the bridge node 15. One output of the transducer 11 is taken from bridge node 25 and connected via lead 65 to an output node 67. Bridge output node 61 is connected through a second series resistor 63 or $R_6$ to ground at a node 37. Node 37 is connected via lead 41 to the current source 57 whose opposite terminal is connected through a lead 83 back to the bridge node 17.

As shown in the circuit of FIG. 5, a current loop I is designated by reference numeral 85, a current loop $I_1$ is designated by reference numeral 87, and a current loop $I_2$ is designated by reference numeral 89. The current equations from the system of FIG. 5, which illustrates the preferred embodiment of the present invention, are as described hereinafter.

The loop equations are:

$$-I_1(R_4+R_5)+I_2(R_1+R_4+R_5+R_6)=V_e+IR_6$$

$$-I_1(R_2+R_3+R_4+R_5)+I_2(R_4+R_5)=IR_3$$

which may be solved simultaneously for $I_1$ and $I_2$ to give:

$$I_1 = \frac{-(V_e + IR_6)(R_4 + R_5) - IR_3(R_1 + R_4 + R_5 + R_6)}{(R_4 + R_5)^2 - (R_1 + R_4 + R_5 + R_6)(R_2 + R_3 + R_4 + R_5)}$$

$$I_2 = \frac{-IR_3(R_4 + R_5) - (V_e + IR_6)(R_2 + R_3 + R_4 + R_5)}{(R_4 + R_5)^2 - (R_1 + R_4 + R_5 + R_6)(R_2 + R_3 + R_4 + R_5)}$$

From the equations for $I_1$ and $I_2$, the transducer output voltages $V_2$ and $V_3$ can be calculated $$V_2 = I_1R_3 + I_2R_6 - I(R_3+R_6)$$

$$V_3 = -I_1R_4 + I_2(R_4+R_6) - IR_6$$

The output voltage of the transducer is of course the difference between $V_2$ and $V_3$, i.e. $V_o = V_2 - V_3$. These equations, while correct, are somewhat opaque. However, assuming that the bridge is balanced, i.e. if $R_2R_4 = R_3R_5$, things are greatly simplified. In the case of a balanced bridge, the output is given by $$V_o = I\frac{R_2R_3}{R_2 + R_3}$$

This is true regardless of the values of the series resistors, or of the other bridge arms provided that the bridge is balanced. This is very nice because it means that if $I = V_b/R$, where $V_b$ is a bias voltage and $R$ is a calibration resistor, as has been proposed herein, then the output is given by $$V_o = \frac{V_b}{R} \cdot \frac{R_2 R_3}{R_2 + R_3}$$

Therefore, it will be seen, in the normal course, the use of shunt current calibration rather than shunt resistor calibration greatly simplifies the formulas involved and hence the resulting accuracy of the calibration signal.

FIG. 6 represents the preferred embodiment of the calibration system of the present invention. In FIG. 6, a bridge-type network of resistive elements makes up the basic transducer 11. A first resistive element 13 has one terminal connected to bridge node 15 and its opposite terminal connected to bridge node 17. Resistive element 19 has one terminal connected to bridge node 17 and its opposite terminal connected to bridge node 21. Resistive element 23 has one terminal connected to the third bridge node 21 and its opposite terminal connected to bridge node 25. Resistive element 27 has one terminal connected to the first bridge node 15 and its opposite terminal connected to bridge node 25. A source of excitation voltage $V_e$ is connected via lead 59 to a node 73. Node 73 is connected through a first series resistor 61 to the first bridge node 15. The third bridge node 21 is connected to ground node 37 through a second series resistor 63. The ground node 37 is connected via lead 35 to a ground output 33 and to various other ground nodes represented by reference numeral 37'. A first transducer output $V_{o1}$ is represented by reference numeral 67 which is connected via lead 65 to the bridge output node 25, while the bridge output node 17 is connected via lead 51 to a node 93. A second transducer voltage output $V_{o2}$ is taken from output terminal 71 which is connected by a lead 69 back to the node 93.

The constant current source used in the preferred embodiment of FIG. 6 includes an operational amplifier 127 having a positive input, a negative input, and an operational amplifier output. The operational amplifier output is connected via lead 145 to the base of a first transistor 107. The emitter of transistor 107 is connected to a node 109, and node 109 is connected to ground node 37' through a calibration resistor 111. The collector of transistor 107 is connected via lead 105 to the switching means of FIG. 6, as hereinafter described. Node 109 is connected via lead 143 back to the negative input of the operational amplifier 127, while the positive input is connected via lead 139 to a node 137. Node 137 is connected through a first variable resistor or potentiometer 141 to ground node 37' and through a second series-connected variable resistor or potentiometer 135 to supply node 115' via lead 133. Power is supplied to the operational amplifier 127 via lead 129 which is connected both to the supply node 115' and to the supply input of the operational amplifier 127. The negative supply input is connected via lead 131 to ground node 37'.

The switching means of the present invention is electrical and includes a differential pair 97 including a second transistor 101 and a third transistor 99. Each of the second and third transistors 101 and 99 include a collector electrode, an emitter electrode, and a base electrode. The emitter electrodes of transistors 101 and 99 are commonly coupled together at node 103 which is connected via lead 105 to the collector of the first transistor 107. The collector of the second transistor 101 is connected directly to the supply at node 115 while the collector of the third transistor 99 is connected via lead 95 back to the output node 93. The series combination of first and second trimmable resistors 119 and 123 are connected between the supply 115' and ground node 37' via lead 117 which connects to one terminal of a trimmable resistor 119 whose opposite terminal is connected to a junction node 121. The junction node 121 connects to one terminal of the second trimmable resistor 123 whose opposite terminal is connected via lead 125 to the ground node 37'.

The feed-back action of the operational amplifier 127 and the transistor 107 keeps the inverting input at the same potential as the non-inverting input of the operational amplifier 127. This makes $I_{e3}$ equal to $V_t/R$, where $I_{e3}$ is the emitter current of the third transistor 107, $V_t$ is the voltage at node 137 and R is the resistance of resistor 111. The collector current of transistor 107 is substantially the same as the emitter current, and this current is switched by the differential pair including transistors 101 and 99 either directly from the supply, when the calibration command signal is low, or through the bridge, when the calibration command signal is high. The calibration command signal $V_{cal}$ is connected via lead 151 directly to the base electrode of transistor 99. The calibration signal should be at least 200 millivolts higher than $V_s$ to turn the calibration current fully on and at least 200 millivolts lower to turn it fully off. Where $V_s$ is the voltage at node 121. The calibration signal should always be less than the voltage at $VO_2$ for the circuit shown, though it would be a simple matter to design the circuit to accept almost any desired switching signal.

For an equal-arm bridge, as shown in FIG. 6, the change in output voltage produced by a calibration current $I_c$ is $V_o = I_c R/2$. If resistor 111 has the same resistance as the bridge arms, the calibration signal is $I_c = V_t/R$, $V_o = V_t/2$. The general case of a bridge with unequal resistors can also be developed. The conclusion is that if the bridge is balanced, with no other constraints $$V_o = \frac{V_t}{R_c} \cdot \frac{R_{13} R_{19}}{R_{13} + R_{19}}$$

where $V_t$ is the voltage at node 137, $R_c$ is the resistance of 111, and $R_{13}$ and $R_{19}$ are the bridge resistors joined at the point from which the current is drawn. Furthermore $V_o$ is changed very little when the bridge is unbalanced by the measurand to the degree that it is typical of a resistive transducer at full-scale operation. It will be noted that the result is independent of the series resistors used to temperature compensate the transducers sensitivity. In the preferred embodiment, the operational implifier used was a National LM324 quad. This opamp was chosen because it is designed to operate from a single supply and its input common mode range goes all the way to 0 volts. It will be noted that current calibration used in the system of FIG. 6 produces a calibration signal substantially independent of transducer output, whether it is temperature compensated or not, and whether it is switched on mechanically, electromechanically, or electrically. The electrical arrangement of switching shown in FIG. 6 is the preferred embodiment thereof, but it will be recognized that any other type of switching could also be used.

It will also be seen that the various resistive elements 13, 19, 23, and 27 of the bridge-type network 11 are commonly formed as a single integrated circuit chip. As an aid in facilitating calibration, the calibration resistor 111 can also be part of the same chip so that it tracks the resistive elements of the bridge exactly, although it may also be independent of the integrated circuit transducer altogether.

What is claimed is:

1. A method of calibrating a transducer arranged in a bridge configuration and having four bridge legs in the sensor, each of said bridge legs including a resistive-type transducer element, said elements being coupled at corresponding bridge nodes, said method of calibration comprising the steps of:

providing a source of substantially constant current, connecting said source in a calibration circuit across one of said resistive-type transducer elements of said bridge configuration;

selectively switching said source into and out of said calibration circuit;

and generating a calibration signal wherein said calibration signal is substantially independent of the transducer output which is temperature compensated.

2. An improved apparatus for calibrating a transducer system employing a bridge network having at least resistive means R1, R2, R3, and R4, and wherein said sensor bridge network includes one terminal of R1 coupled to one terminal of R2 at a first bridge node, the opposite terminal of R2 coupled to one terminal of R3 at second bridge node, the opposite terminal of R3 coupled to one terminal of R4 at a third bridge node, and the opposite terminal of R4 coupled to the opposite terminal of R1 at a fourth bridge node, wherein said transducer system further includes means for connecting a source of excitation signals to said first bridge node, means for coupling said third bridge node to ground, a first transducer output coupled to said second bridge node, and a second transducer output coupled to said fourth bridge node, said improved apparatus for calibrating said transducer system comprising:

an electrical calibration circuit coupled between said fourth bridge node and ground;

a source of substantially constant current operatively disposed in said electrical calibration circuit; and switching means operatively disposed in said electrical calibration circuit for selectively connecting said current to said fourth bridge node for generating a calibration signal.

3. A system of calibrating a transducer comprising a bridge-type network having four bridge legs in the sensor, each of said bridge legs including a resistive-type transducer element joined at four intermediate bridge nodes, said calibration system comprising:

a source of substantially constant current;

calibration circuit means including said source for connecting same across one of said resistive-type transducer elements; and switching means operatively disposed in said calibration circuit means for selectively shutting off the supply of current to said one of said resistive-type transducer elements and turning on the supply of calibration current to said one of said resistive-type transducer elements for generating a calibration signal wherein said calibration signal is substantially independent of the transducer output which is temperature compensated.

4. The improvement of claim 2 wherein said generated calibration signal is substantially independent of the transducer output whether or not it is temperature compensated and whether said switching means is mechanical, electromechanical, or electrical.

5. The improvement of claim 2 wherein said switching means is electrical.

6. The improvement of claim 2 wherein said source includes a calibration resistor $R_c$, where $R_c$ has the same temperature coefficient as the resistive means of the bridge network and operates in the same thermal environment.

7. The improvement of claim 6 wherein said transducer system is an integrated circuit and $R_c$ is part of said integrated circuit.

8. The improvement of claim 6 wherein said transducer is an integrated circuit and wherein $R_c$ is separate and independent therefrom.

9. The improvement of claim 6 wherein $R_c$ may be any convenient sized resistor and need not be trimmed.

10. The calibration system of claim 3 wherein said transducer is an integrated circuit and wherein said source, said calibration circuit means, and said switching means are not part of said integrated circuit.

11. The calibration system of claim 3 wherein said transducer is an integrated circuit and wherein said source, said calibration circuit means, and said switching means are part of the same integrated circuit.

12. The calibration system of claim 3 wherein said source includes a calibration resistor $R_c$.

13. The calibration system of claim 12 wherein said transducer is an integrated circuit and where $R_c$ is a resistor on said integrated circuit such that it will track the resistive-type transducer elements of said bridge over temperature.

14. The calibration system of claim 3 wherein the calibration current $I_c$ produced by said source of substantially constant current is made inversely proportional to said bridge arm resistance by an internal calibration resistor $R_c$.

15. The calibration system of claim 14 wherein said calibration resistor $R_c$ can be almost any value and it need not be trimmed.

16. The calibration system of claim 15 wherein the change in output voltage produced by switching in said calibration current $I_c$ is independent of temperature provided the calibration resistor $R_c$ accurately tracks the resistive-type transducer elements of said bridge over temperature.

17. The calibration system of claim 16 wherein said output voltage is substantially constant even when the bridge is significantly unbalanced.

18. The calibration system of claim 3 wherein said bridge-type network includes first, second, third, and fourth bridge nodes, a first series resistor having one terminal connected to said first bridge node, a second series resistor having one terminal connected to said third bridge node, a source of excitation signal $V_e$, means for coupling $V_e$ to the opposite terminal of said first series resistor, a first signal output $V_{o1}$ taken from said second bridge node, a second signal output $V_{o2}$ taken from said fourth bridge node, and means for grounding the opposite terminal of said second series resistor;

said calibration circuit means being connected between said fourth node and ground.

19. The calibration system of claim 18 wherein said source includes a calibration resistor $R_c$ and wherein said output is substantially independent of the transducer output regardless of whether or not it is temperature compensated and whether it is switched mechanically, electromechanically, or electrically.

20. The calibration system of claim 19 wherein said transducer is an integrated circuit and $R_c$ is part of said integrated circuit so that it tracks said resistive-type transducer elements of said bridge network over temperature.

21. The calibration system of claim 19 wherein said transducer is an integrated circuit and $R_c$ is independent therefrom, but where $R_c$ has the same temperature coefficient as the resistive-type transducer elements of the bridge circuit and operates in the same thermal environment.

22. The calibration system of claim 21 wherein $R_c$ can be of any convenient value and need not be trimmed.

23. The calibration system of claim 18 wherein said source of substantially constant current includes:
   an operational amplifier means having a positive input, a negative input, and an output;
   a first transistor means having a collector electrode, an emitter electrode, and a base electrode;
   a calibration resistor operatively connected between said emitter electrode of said first transistor and ground;
   a means for connecting the output of said operational amplifier means to said base electrode of said first transistor means for controlling the operation thereof;
   feedback means operatively coupling said emitter electrode of said first transistor means to the negative input of said operational amplifier means; and
   means for supplying a voltage signal to the positive input of said operational amplifier means;

24. The calibration system of claim 23 further including a pair of variable resistor means operatively connected in a series path between said source of excitation voltage and ground, and wherein said means for supplying a voltage signal to the positive input of said operational amplifier means includes means for coupling the junction of said pair of variable resistor means to the positive input of said operational amplifier means.

25. The calibration system of claim 24 wherein said switching means includes a pair of transistors configured as a differential pair, said pair including second and third transistors each having a collector electrode, an emitter electrode, and a base electrode, said emitter electrodes being commonly connected to each other, means for coupling said commonly connected emitters to the collector electrode of said first transistor means, means for connecting said collector electrode of said second transistor to said source of excitation voltage, means for connecting the collector electrode of said third transistor to said fourth bridge node, a source of calibration command signals, and means for connecting said source of calibration command signals to the base electrode of said third transistor for controllably switching same for calibration purposes.

26. The calibration system of claim 25 further including a pair of trimmable resistors operatively coupled in a series of path between said source of excitation voltage and ground, and means for operatively connecting the junction of said pair of resistors to the base electrode of said second transistor of said differential pair.

27. An improved method for calibrating a transducer wherein the transducer is configured in a sensor bridge network including four resistive means R1, R2, R3, and R4, and wherein sensor one terminal of R1 is connected to one terminal of R2 at a first bridge node, the opposite terminal of R2 is connected to one terminal of R3 at a second bridge node, the opposite terminal of R3 is connected to one terminal of R4 at a third bridge node, and wherein the opposite terminal of R4 is connected to the opposite terminal of R1 at a fourth bridge node, and wherein a source of excitation voltage is operatively coupled to said first bridge node, said third bridge node is operatively coupled to ground, and said second and fourth bridge nodes serve as transducer outputs, said improved method of calibration comprising the steps of:
   generating a substantially constant calibration current;
   connecting an electrical circuit between bridge nodes four and three; and
   switching said generated current away from and into said fourth bridge node for generating a calibration signal which is substantially independent of the transducer output whether or not it is temperature compensated and whether it is mechanically or electrically switched.

28. The improvement of claim 6 wherein said transducer system includes a first series resistor operatively connected between said means for coupling excitation signals and said first bridge node and a second series resistor operatively connected in said grounding means between said third bridge node and ground, and wherein said transducer system is an integrated circuit and said first and second series resistors are part of said integrated circuit.

29. The improvement of claim 25 wherein said source includes:
   an operational amplifier means having a positive input, a negative input, and an operational amplifier output;
   a first transistor having an emitter electrode, a collector electrode, and a base electrode;
   a calibration resistor $R_c$ operatively coupled between said emitter electrode and ground;
   means for operatively connecting the junction of said emitter electrode and said calibration resistor $R_c$ back to the negative input of said operational amplifier means;
   means for supplying a voltage control signal to said positive input of said operational amplifier means; and
   means for connecting the collector electrode of said first transistor to said switching means.

30. The improvement of claim 29 wherein said means for supplying said voltage control signal to the positive input of said operational means includes:
   a pair of variable resistor means connected in series between said source of excitation signals and ground; and
   means for connecting the junction of said pair of resistor means to said positive input of said operational amplifier means.

31. The improvement of claim 29 wherein said switching means is electrical.

32. The improvement of claim 31 wherein said electrical switching means includes a differential pair having a second transistor and a third transistor, each of said second and third transistors having an emitter electrode, a collector electrode, and a base electrode, the collector electrode of said second transistor being operatively connected to said source of excitation signals, the emitter electrode of both said second and third transistors being commonly coupled together and said means for connecting the collector electrode of said first transistor to said switching means includes means for connecting said commonly coupled emitters to said collector electrode of said first transistor, and said collector electrode of said third transistor being directly connected to said fourth bridge node for supplying calibration current thereto for calibration purposes.

33. The improvement of claim 32 wherein said switching means further includes a pair of resistors connected in series between said source of excitation signals and ground and means for connecting the junction of said pair of resistors to the base electrode of said second transistor.

34. The improvement of claim 32 wherein said switching means includes means operatively connected to the base electrode of said third transistor for controlling the supplying of calibration current to said fourth bridge node for calibration purposes.

* * * * *